(12) United States Patent
Redaelli et al.

(10) Patent No.: US 9,893,279 B2
(45) Date of Patent: Feb. 13, 2018

(54) METHODS, APPARATUSES, AND CIRCUITS FOR PROGRAMMING A MEMORY DEVICE

(71) Applicant: Micron Technology, Inc., Boise, ID (US)

(72) Inventors: Andrea Redaelli, Calolziocorte (IT); Agostino Pirovano, Milan (IT); Umberto M. Meotto, Rivoli (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/438,499

(22) Filed: Feb. 21, 2017

(65) Prior Publication Data

US 2017/0229644 A1  Aug. 10, 2017

Related U.S. Application Data (62) Division of application No. 14/477,680, filed on Sep. 4, 2014, now Pat. No. 9,614,005, which is a division of application No. 13/218,374, filed on Aug. 25, 2011, now Pat. No. 8,830,722.

(51) Int. Cl.
*G11C 13/04* (2006.01)
*H01L 45/00* (2006.01)
*H01L 27/24* (2006.01)

(52) U.S. Cl.
CPC ...... *H01L 45/1286* (2013.01); *H01L 27/2436* (2013.01); *H01L 45/06* (2013.01); *H01L 45/1233* (2013.01); *H01L 45/144* (2013.01); *H01L 45/1608* (2013.01); *G11C 13/04* (2013.01)

(58) Field of Classification Search
CPC .. G11C 13/0004; G11B 7/00454; G11B 7/243
USPC .................................................. 365/113, 163
See application file for complete search history.

(56) References Cited

U.S. PATENT DOCUMENTS

| | | |
|---|---|---|
| 5,602,053 A | 2/1997 | Zheng et al. |
| 7,135,696 B2 | 11/2006 | Karpov et al. |
| 7,750,335 B2 | 7/2010 | Clevenger et al. |
| 2005/0158950 A1 | 7/2005 | Scheuerlein et al. |
| 2006/0073631 A1* | 4/2006 | Karpov ............... H01L 27/2427 438/102 |
| 2007/0176255 A1 | 8/2007 | Kreupl et al. |
| 2008/0251886 A1 | 10/2008 | Kobayashi |

FOREIGN PATENT DOCUMENTS

| | | |
|---|---|---|
| EP | 2034536 A1 | 3/2009 |
| WO | WO 2006041430 A1 | 4/2006 |

\* cited by examiner

*Primary Examiner* — Jason Lappas
(74) *Attorney, Agent, or Firm* — Holland & Hart LLP (57) ABSTRACT

Subject matter described pertains to methods, apparatuses, and circuits for programming a memory device.

20 Claims, 4 Drawing Sheets

METHODS, APPARATUSES, AND CIRCUITS FOR PROGRAMMING A MEMORY DEVICE

RELATED APPLICATIONS

The present application for patent is a divisional application of U.S. patent application Ser. No. 14/477,680 by Redaelli et al., entitled "Methods, Apparatuses, and Circuits for Programming a Memory Device," filed Sep. 4, 2014 which is a divisional application of U.S. patent application Ser. No. 13/218,374 by Redaelli et al., entitled "Methods, Apparatuses, and Circuits for Programming a Memory Device," filed Aug. 25, 2011, assigned to the assignee hereof, and each of which is expressly incorporated by reference in its entirety herein.

BACKGROUND

Certain types of methods and apparatuses that involve memory devices and circuits may make use of thermal energy to bring about a change in an observable property of a memory material within a memory device. On occasion, it may be useful to bring about a change in a manner to conserve thermal energy.

BRIEF DESCRIPTION OF THE DRAWINGS

Embodiments of claimed subject matter are illustrated by way of example and not by way of limitation in the figures of the accompanying drawings, in which:

DESCRIPTION OF EMBODIMENTS

In the following detailed description, reference is made to the accompanying figures that show, by way of illustration, specific embodiments of claimed subject matter. Embodiments are described in sufficient detail to enable those skilled in the art to practice claimed subject matter. It is to be understood that various embodiments of claimed subject matter, although different, are not necessarily mutually exclusive. For example, a particular feature, structure, or characteristic described herein in connection with one embodiment may be implemented within other embodiments of claimed subject matter. In addition, it is to be understood that a location or arrangement of individual elements within a disclosed embodiment may be modified. The following detailed description is, therefore, not to be taken in a limiting sense, and subject matter for the present application is defined by the issued claims, appropriately interpreted, along with a full range of equivalents to which the issued claims are entitled. In the drawings, like numerals refer to the same or similar functionality throughout the several views unless otherwise suggested.

Some portions of the following description are presented in terms of logic, algorithms or symbolic representations of operations on binary states stored within a memory of a specific apparatus or special purpose computing device or platform. In the context of the specification, the term "specific apparatus" or the like includes a general-purpose computer once it is programmed to perform particular functions pursuant to instructions from program software. Algorithmic descriptions or symbolic representations are examples of techniques used by those of ordinary skill in the data processing or related arts to convey the substance of their work to others skilled in the art. An algorithm is here, and generally, considered a self-consistent sequence of operations or similar data processing leading to a desired result. In this context, operations or processing involve physical manipulation of physical quantities. Typically, although not necessarily, quantities may take the form of electrical or magnetic signals capable of being stored, transferred, combined, compared, or otherwise manipulated as electronic signals that represent information states. It has proven convenient at times, principally for reasons of common usage, to refer to signals as bits, data, values, elements, symbols, characters, terms, numbers, numerals, information, or the like. It should be understood, however, that all of these or similar terms are to be associated with appropriate physical quantities and are merely convenient labels. Unless specifically stated otherwise, as apparent from the following discussion, it is appreciated that throughout the specification, discussions utilizing terms such as "processing," "computing," "calculating," "determining", "establishing", "obtaining", "identifying", "selecting", "generating", or the like may refer to actions or processes of a specific apparatus, such as a special purpose computer or a similar special-purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special-purpose electronic computing device.

The terms "coupled" and "connected" along with their derivatives may be used. It should be understood that these terms are not intended as synonyms for each other. Rather, in particular embodiments, "connected" may be used to indicate that two or more elements are in direct physical or electrical contact with each other. "Coupled" may be used to indicate that two or more elements are in either direct or indirect (with other intervening elements between them) physical or electrical contact with each other, or that the two or more elements cooperate or interact with each other.

Some embodiments of claimed subject matter may involve "heating," which may result, at least in part, from "Joule," "resistive," or "ohmic" conversion of electrical current to thermal energy. Additionally, embodiments of claimed subject matter may involve a "switch" or a "switching element," which may result from any one of numerous processes for controlling or modulating an electrical signal. In one example, a use of a metal oxide semiconductor (MOS) transistor switch, in which a signal present on a gate of a transistor may bring about a current flow from a drain to a source of the transistor switch, may include performing a switching function. Switching may also result from a current flowing from a first portion of a device to a second portion of a device triggered, at least in part, by an external signal. However, these are merely illustrative examples, and claimed subject matter is not limited in this respect.

Embodiments of claimed subject matter may involve "dispose" or "disposing" in which a first material may be deposited over a second material, for example. In an embodiment, one or more of a variety of chemical or metal oxide vapor deposition, sputtering, or other semiconductor process may be used to dispose a first material over a second material or including on a second material. Embodiments of claimed subject matter may involve an "etch" or "etching" process that may, for example, pertain to a Damascene process in which a length of a conductor may result from creating a trench and overfilling it with conductor material. Excess material may be removed using chemical mechanical planarization (CMP), for example, to remove access material from locations other than the trench.

Embodiments of claimed subject matter may involve an "active material," such as a material comprising a phase change memory (PCM), which may, for example, undergo a reversible transition from a crystalline state to an amorphous state as a result of thermal energy imparted to the material. In an implementation, an active material may comprise a PCM material in a crystalline state that may exhibit a lower resistance than a PCM material in an amorphous state. An active material may comprise a PCM material used as a memory cell, which may store one or more information states based on, at least in part, a higher-resistance or a lower-resistance state of the material. In an implementation, an active material may comprise a PCM material used as a fuse in which the material may be heated to a temperature resulting, at least in part, in a rupture of the device that may not be easily reversed. In an implementation, a PCM material comprising a rupture may exhibit a higher resistance state.

Embodiments of claimed subject matter may involve an "offset" distance, which may, for example, pertain to a distance from a point directly above an active portion of a memory material to an edge of a conductive material. Embodiments of claimed subject matter may involve an applicable "lithographic pitch," which may correspond to a width of the narrowest parallel lines or the narrowest parallel spaces that may be formed employing a lithographic tool or process. However, these are merely examples, and claimed subject matter is not limited in this respect.

Figure 1:
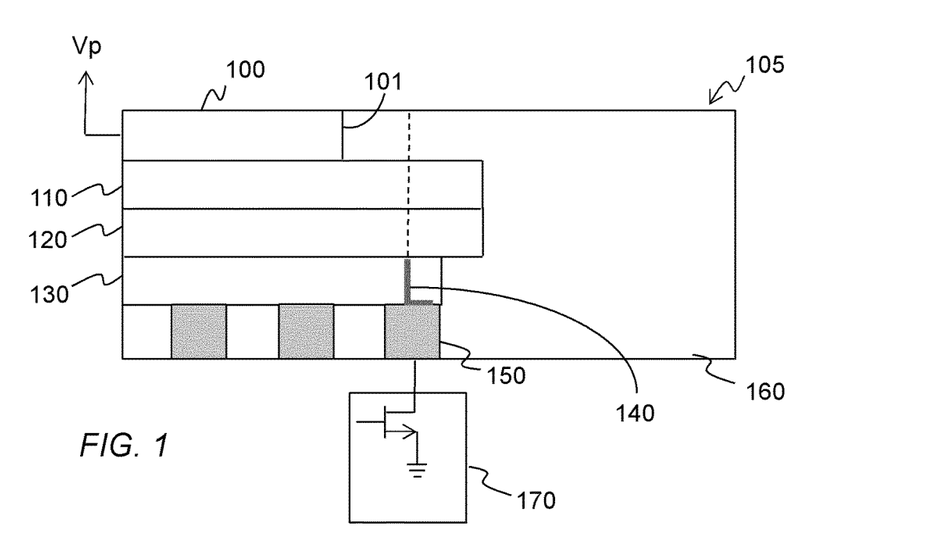
FIG. 1 shows at least a portion of a memory device according to an embodiment of claimed subject matter.

FIG. 1 shows at least a portion of a memory device (105) according to one embodiment of claimed subject matter. In FIG. 1, an application of programming voltage, Vp, may generate an electrical current in electrical conductor 100 that may flow from Vp to edge 101. In an embodiment, a programming voltage may comprise approximately 1V, although nothing prevents use of programming voltages having a greater magnitude, such as 3V to 5V, or having a lesser magnitude, such as 500 mV or 100 mV. Of course, these are non-limiting examples. Additionally, conductor 100 may comprise a conductive material, such as copper, although nothing prevents use of other conductive materials, such as aluminum, that may be capable of conveying an electrical current. Again, these are non-limiting examples.

In at least one embodiment, active material 120, for example, may include a chalcogenide PCM material. A PCM material may include germanium (Ge), antimony (Sb), and tellurium (Te), such as $Ge_2Sb_2Te_5$, for example, which may undergo a phase change at least partially as a function of heat applied, for example. Active material 120 may also include materials such as Gold (Ag), Indium (In), Sb, and Te, such as AgInSbTe, InSe, Sb Se, SbTe, InSbSe, SbTe, or combinations thereof, and/or any other material capable of storing information by way of a phase change that may be affected at least partially by applying thermal energy.

Separation material 110 may be disposed under, such as beneath, conductor 100 or may be immediately adjacent conductor 100. Separation material 110 may be applied to reduce or eliminate a likelihood that materials in a semiconductor structure, such as illustrated in FIG. 1, might migrate across 110, including from a first side of material 110 to a second side of material 110. In FIG. 1, separation material 110 may intervene to act as a diffusion barrier that may reduce electromigration between conductor 100, which may be disposed over or included on material 110, and active material 120, which may be disposed below or immediately to adjacent material 110.

Separation material 110 may comprise a refractory metal, such as a titanium alloy or other compound, such as titanium/titanium nitride, tungsten, titanium/tungsten alloy, chromium, tantalum, or their alloys, to provide non-limiting examples. In at least one embodiment, such as FIG. 1, material 110 may comprise approximately 40 to 60 nm in thickness and may include a titanium nitride material of approximately 15-30 nm and a tungsten material of approximately 20-40 nm. However, nothing prevents using other materials and/or materials having thicknesses within different ranges. Claimed subject matter is not limited to use of particular materials and/or thicknesses.

As mentioned previously, active material 120 may be disposed under, such as beneath, separation material 110. In a largely resistive phase, which may result from heating a memory material beyond a phase change temperature for a short period of time, for example, a material comprising active material 120 may transition to an amorphous phase, for example. In a largely conductive phase, which may result from heating a material to a lower temperature than above and for a longer period of time, a material may transition to a crystalline phase. Further, an amorphous or a crystalline phase of a material may persist for an extended period of time after a heat source is removed from contact with the material. Resistance, such as to a current passing through a memory material, may be observed by way of measuring a drop in voltage signal level across contacts of a device. Resistance may be used to store a state, such as one or more binary digits that may represent one or more information states.

In at least one embodiment, device heater 140 may be disposed under, such as beneath, active material 120 and at least partially embedded within or surrounded by dielectric material 130. In FIG. 1, device heater 140 may, for example, comprise an "L" shape and may comprise titanium nitride, titanium nitride doped with silicon, and/or other type of titanium nitride composite, for example. In other embodiments, device heater 140 may assume other shapes or include other types of materials that may exhibit heating properties at least partially in response to an electrical current; however claimed subject matter is not necessarily so limited.

Dielectric material 130 may partially or fully surround device heater 140 and may include an insulating dielectric oxide or nitride that may possess electrical and thermal insulation properties. Dielectric material 160 may also include an oxide or nitride that may possess electrical and/or thermal insulation properties. In an embodiment in which dielectric material 130 and 160 comprise Silicon Nitride ($Si_3N_4$), for example, materials 130 and 160 may exhibit a resistivity within a range of approximately $10^{12}$ ohm-cm to $10^{16}$ ohm-cm and a thermal conductivity in the range of approximately 20 W/m° K to 40 W/m° K. However, claimed subject matter is not necessarily so limited.

A conductive plug 150 may be disposed under, such as beneath, device heater 140. In at least one embodiment, conductive plug 150 may be coupled to a switch 170. Although shown as a metal oxide semiconductor transistor, other types of switches and/or switching elements may, of course, be used. In at least one embodiment, an N-channel metal oxide semiconductor transistor (NMOS) may be employed and may include, among other features, an ability to generate reverse bias polarity. However, claimed subject matter is not limited in this respect.

Figure 1A:
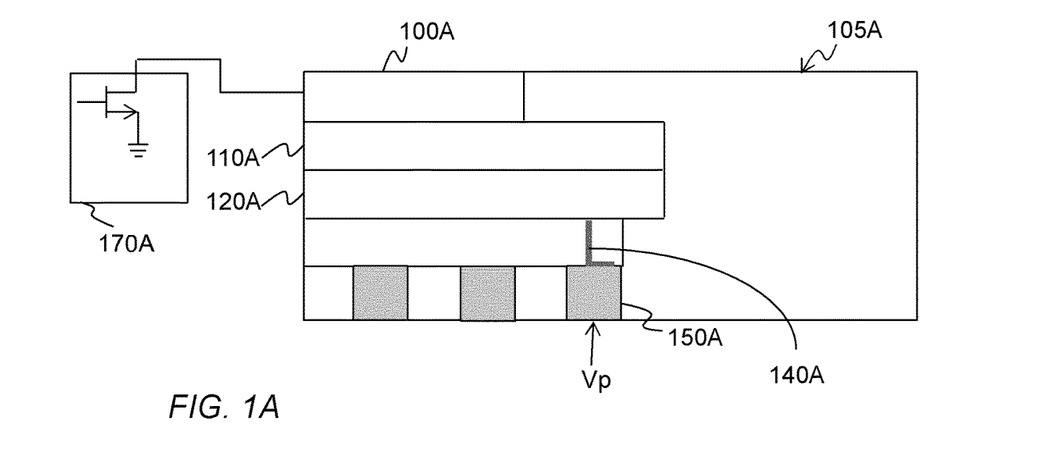
FIG. 1A shows at least a portion of a memory device according to an embodiment of claimed subject matter.

FIG. 1A shows at least a portion of a memory device (105A) having similarities with the embodiment of FIG. 1. In FIG. 1A, switch 170A, implemented by way of an NMOS transistor, may have a configuration with a drain in contact with conductor 100A. Accordingly, current may flow from Vp through conductive plug 150A, device heater 140A, active material 120A, separation material 110A, conductor 100A, and through switch 170A to ground, for example. In an implementation, active material 120A may be heated beyond a temperature at which one or more of material 120A, device heater 140A, and/or conductive plug 150A undergoes a rupture, for example, and may exhibit higher resistivity. In an implementation, if device 105A undergoes a rupture, the device may not be easily returned to a lower resistance state.

Figure 2:
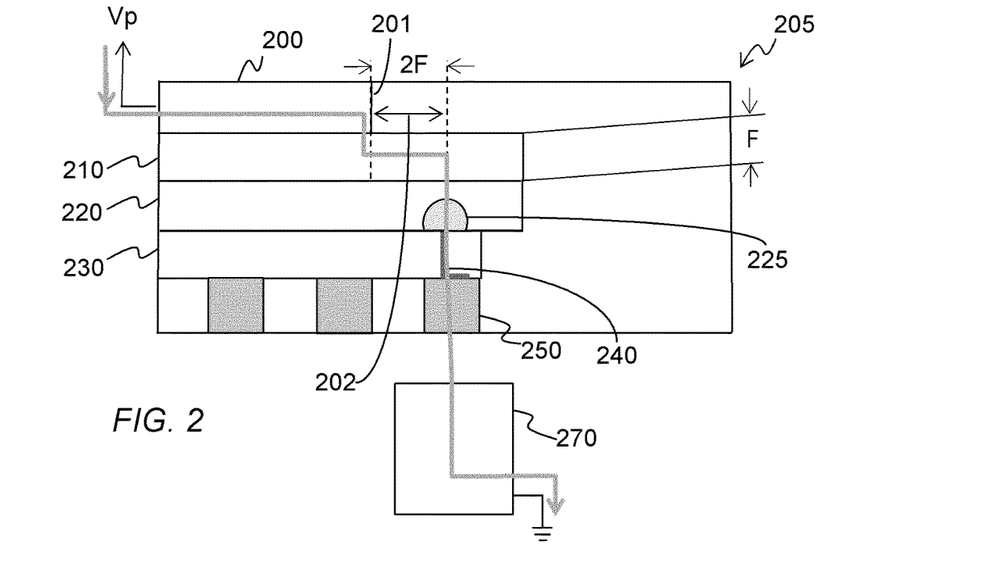
FIG. 2 shows electrical current flow through the embodiment of FIG. 1.

FIG. 2 shows the embodiment of FIG. 1 with an electrical current flowing as described below. In at least one embodiment, a relative thickness, F, of separation material 210 with respect to a lateral distance 202, such as 2F, is shown. Material 210 may extend beyond or be offset from edge 201 of conductor 200 to a location at least approximately directly above device heater 240. In FIG. 2, F may indicate a dimension approximately equal to one-half of a pitch of an applicable lithographic process used to lay out memory device 205, for example. In one example, in which a 100 nm lithographic process may be used, a lateral distance may comprise approximately 100 nm.

Other embodiments of claimed subject matter may employ other lithographic processes, including some with different pitches providing a different or offset lateral distance. In other embodiments, a material thickness and a lateral distance that separation material 110 extends beyond edge 101 of conductor 100 to a point directly above device heater 140 need not be precisely related by a ratio of F:2F. Alternatively, they may be related in another manner. For example, they may be related by a ratio of F:F, in which a material thickness and a lateral distance may be approximately equal. In another embodiment, these may be related by a different ratio, such as F:3F. In other embodiments, thickness and lateral distance may not even be related by way of a ratio. However, these are merely examples, and claimed subject matter is not limited in this respect.

In FIG. 2, direction of an electrical current may be shown originating at Vp and terminating at electrical ground. Accordingly, a current applied from Vp may travel laterally across conductor 200, for example, which may comprise copper, aluminum, or other conductive material, until approximately reaching edge 201. After reaching edge 201, current may travel through a portion of material 210, as illustrated by example. Such path may be a path of lesser or least resistance; however, the embodiments are not so limited. Current may travel through portion 225 of active material 220 to a top portion of device heater 240 within dielectric material 230. After passing through device heater 140, current may travel through conductive plug 250 and through switch 270.

One or more embodiments may make use of a separation material that comprises a titanium alloy or a compound such as titanium/titanium nitride, tungsten, titanium/tungsten alloy, chromium, tantalum, and/or their alloys, to provide a diffusion barrier, such as an electromigration barrier, between a conductor and an active material. For example, a portion of a separation material 210 may introduce a resistance per unit length larger than a resistance per unit length of a conductor. In an embodiment, for example, in which material 210 may comprise tungsten nitride having a sheet resistance of 300 to 400 micro-ohms/square, a portion of material 210 may comprise a material of lesser resistance, such as approximately 50 ohms to 150 ohms.

In other embodiments, different constituent elements may be used for material 210, and/or material 210 may be thicker, such as for example, 1.6F (approximately 80 nm), or a portion of material 210 may be shorter in length, for example 0.8F (approximately 40 nm). In these embodiments, material 210 may introduce smaller resistance, such as about 40 ohms or less. In other embodiments, which may involve use of different constituent elements for material 210, or in which material 210 may be thinner, such as for example, 0.6F (approximately 30 nm), or in which material 210 is of a greater length, for example 3F (approximately 150 nm), material 210 may introduce greater resistance, such as about 150 ohms, about 200 ohms, about 300 ohms, or more. However, these are merely examples, and claimed subject matter is not limited in this respect.

After passing through material 210, current may continue through active material 220. A memory material that may be transitioned from a largely resistive phase to a largely conductive phase may comprise active material 220. Such a transition from crystalline to amorphous or from amorphous to crystalline may allow a memory material to store a state as one or more encoded binary digits according to a resistive phase of a memory material, for example. A material may be included within active material 220 in various states through a variety of technologies as a result of a manufacturing process used to fabricate a device structure. Accordingly, an electrical current flowing through portion 225 of active material 220 may reach a top portion of device heater 240 without active material 220 introducing significant resistance.

As an electrical current may continue through device heater 240, Joule, resistive, or ohmic heating of device heater 240 may result. As a result of device heater 240 increasing in temperature, portion 225 of active material 220, near a top portion of device heater 240 may undergo heating as well. As portion 225 of active material 220 heats, memory material of portion 225 may change from a crystalline phase to an amorphous phase. In at least one embodiment, for example, an electrical current may function to program portion 225 of active material 220, such as by way of device heater 240. After continuing through device heater 240, electrical current may be applied to conductive plug 250, via a switching device 270, and to electrical ground.

In FIG. 2, it can be seen that edge 201 of conductor 200 is offset from a point directly above portion 225 of active material 220 by an amount approximately equal to 2F. In an embodiment, locating edge 201 away from a point directly above portion 225 may result in a small amount, or even a negligible amount, of heat from portion 225 conducting to conductor 200. Accordingly, if conductor 200 comprises a material that may be thermally conductive as well as electrically conductive, although heat from portion 225 may affect conductor 200, locating conductor 200 away from a point directly above portion 225 may desirably reduce coupling of thermal energy from portion 225 to conductor 200. In one embodiment, for example, an ability to reduce coupling of thermal energy from portion 225 to conductor 200 may result in an ability to reduce a current that may be used to program portion 225. Reducing a current that may be used in programming portion 225 may contribute to a decrease in failures that result, at least in part, from excess current used in programming.

In an embodiment, if an edge, such as edge 201 of conductor 200, is offset by a larger distance from a point directly above portion 225 of active material 220, such as a distance of about 3F, or greater, resistance resulting from electric current flow through separation material 210 may be expected to increase. Thus, for example, if conductor 200 were offset by a distance of about 3F (approximately 150 nm), for example, an additional resistance may result.

Assuming a typical resistivity, approximately 50 ohms of additional resistance may result. In another example, if conductor 200 were offset a distance of about 4F (approximately 200 nm) an additional resistance of perhaps 100 ohms may result. Accordingly, an offset design trade-off may be made, which may result in a decrease in conduction of heat energy from portion 225 to conductor 200, for example. However, in the event that conductor 200 is offset a greater distance, separation material may exhibit an additional resistance.

In an embodiment, in which Vp may be set to approximately 1V during a programming operation of portion 225 of active material 220, as an illustrative example, a voltage drop resulting from separation material 210 may approximate about 100 mV. In other embodiments, if programming portion 225 of active material 220, it may be desirable for separation material 210 to exhibit smaller voltage drops, such as about 50 mV or less, for example. In embodiments, a smaller offset of edge 201 from portion 225, such as F, may approximate about 50 nm. In other embodiments, larger voltage drops resulting from separation material 210 may be tolerated, such as about 200 mV or more. However, these are merely examples, and claimed subject matter is not limited in this respect.

Figure 2A:
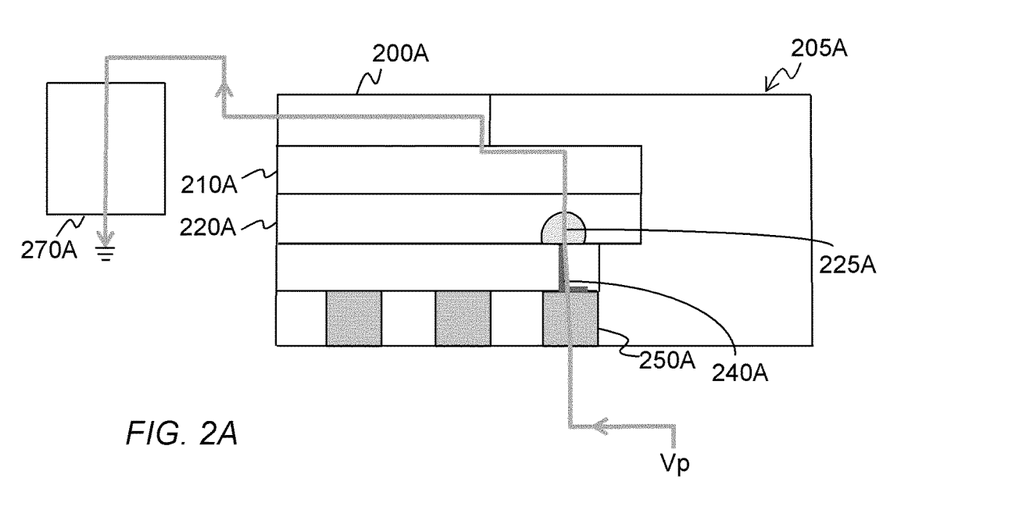
FIG. 2A shows electrical current flow through the embodiment of FIG. 1A.

FIG. 2A shows electrical current flow through the embodiment of FIG. 1A. In an implementation, device heater 240A may heat portion 225A of active material 220A to a temperature beyond the temperature at which one or more of portion 225A, device heater 240, and/or conductive plug 250 may rupture, for example. In an implementation, current may flow from Vp through conductive plug 250A, device heater 240A, portion 225A of active material 220A, separation material 210A, conductor 200A, and through switch 270A to ground, for example. In an implementation, if a portion of device 205A undergoes a rupture, the device may not be easily returned to a lower resistance state.

Figure 3:
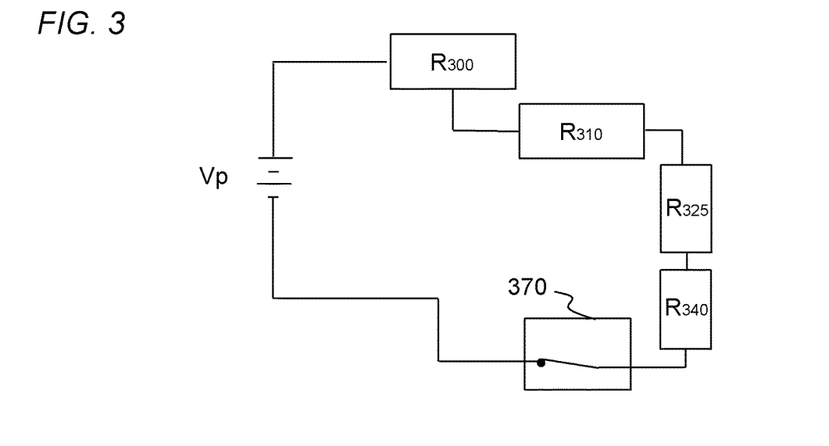
FIG. 3 shows a diagram of circuit elements that may represent a circuit embodiment of FIG. 1.

FIG. 3 shows a diagram (300) of circuit elements that may represent a circuit embodiment of FIG. 1. In FIG. 3, Vp may represent a voltage source applied to a conductive path such as previously described, for example. A voltage signal from Vp may be conveyed through $R_{300}$, which may represent a resistance of a conductive path to which an electrical current from Vp may be applied such as previously described, for example. A value for $R_{300}$ may be small, such as from about 10 ohms or less.

Current from $R_{300}$ may flow through $R_{310}$, which may represent a resistance resulting from a separation material, such as material 110 and 210 of FIGS. 1 and 2, for example. Material 110 and 210 may represent a resistance of perhaps about 50 ohms or less to a value perhaps as high as about 500 ohms or more. $R_{310}$ may be contemplated as being in a region of about 100 ohms, although claimed subject matter is not limited in this respect.

Current from $R_{310}$ may continue to $R_{325}$, which may represent a portion of a PCM material programmed by an electrical current. An electrical current may flow through memory portion 125 or 225, represented by $R_{325}$, to a device heater, represented by $R_{340}$. In the embodiment of FIG. 3, the $R_{340}$ may perhaps be larger than $R_{300}$, $R_{310}$, or $R_{325}$. Accordingly, current flow through $R_{340}$ may result in an increase in a temperature of a device heater, represented by $R_{340}$, which may raise a temperature of a portion of a PCM material to a value beyond a melting point. Therefore, a portion of a phase change material may store one or more information states. Current may be returned to a negative terminal of Vp by way of switching device 370.

Figure 4:
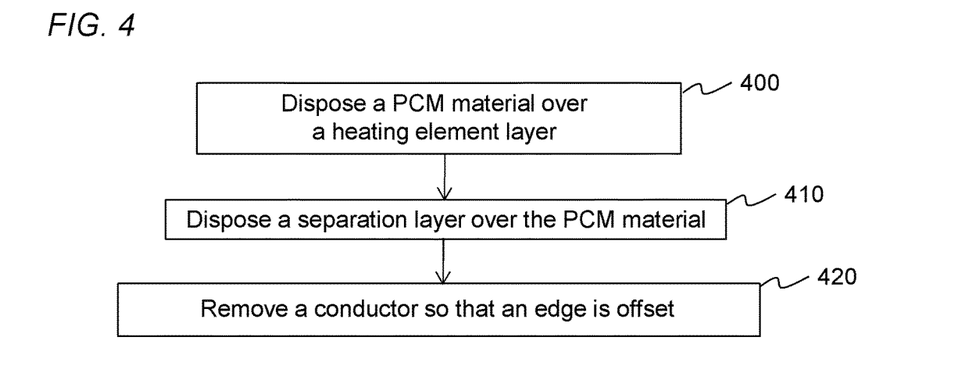
FIG. 4 shows a flow chart for at least part of a method of making a memory device according to an embodiment of claimed subject matter.

FIG. 4 shows a flow chart for at least a portion of a method of making a memory device according to an embodiment. In some embodiments, the apparatus of FIG. 1 may be suitable for performing the method of FIG. 4, although nothing prevents performing the method of FIG. 4 using alternate arrangements of components in other embodiments. Embodiments may include additional blocks than those shown and described in FIG. 4, fewer blocks, blocks occurring in an order different from FIG. 4, or any combination thereof.

FIG. 4 begins at block 400, which may include disposing a PCM material, such as a portion of a chalcogenide glass active material, over or on a device heater. Block 400 may include depositing a dielectric material that at least partially surrounds a device heater comprising titanium nitride, titanium nitride doped with silicon, or other type of titanium nitride composite. In block 400, a dielectric material may include, for example, an insulating dielectric oxide or nitride that possesses suitable electrical and/or thermal insulation properties.

Continuing at block 410, in which a separation material may be disposed over, including on, a memory device, perhaps, for example, in which about a 20 nm film of titanium nitride may be deposited or sputtered followed by about a 30 nm tungsten film deposited in a similar manner, for example. A separation material introduced at block 410 may possess an electrical resistance of about 5% to about 10%, for example, of a resistance exhibited by a device heater disposed at block 410. However, in some embodiments, a separation material may introduce a larger electrical resistance, which may be as high as about 50% or more of a resistance exhibited by a device heater in other examples.

Continuing, block 420 may include at least partially removing a conductor, typically in the form of a conductor material over a separation material, in which a conductor includes an edge that may be offset from a point directly above a PCM material, for example. In an embodiment, a small or negligible amount of heat generated by a device heater may conduct away from the device heater. In one embodiment, block 420, may include the use of a damascene process to fabricate a conductive path followed by chemical mechanical planarization. However, claimed subject matter is not limited in this respect.

Figure 5:
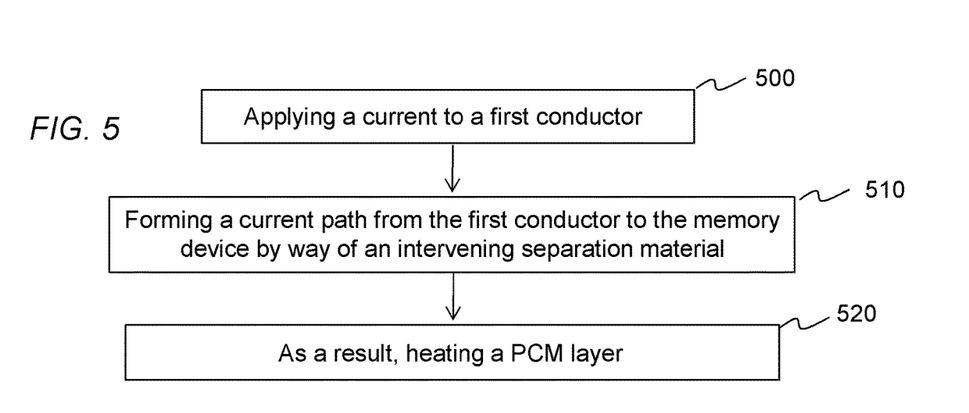
FIG. 5 shows a flow chart for at least part of a method of operating a memory device according to an embodiment of claimed subject matter.

FIG. 5 shows a flow chart for at least portion of a method of operating a memory device according to an embodiment. In some embodiments, the apparatus of FIG. 1 may be suitable for performing the method of FIG. 5, although nothing prevents performing the method of FIG. 5 using alternate arrangements of components in other embodiments. Embodiments of claimed subject matter include additional blocks than those shown and described in FIG. 5, fewer blocks, blocks occurring in an order different from FIG. 5, or any combination thereof Block 500 describes that a current may be applied to a first conductor. At block 510, a current path may form from a first conductor by way of an intervening separation material. At block 510, a separation material may include titanium nitride, tungsten, or other metals or compounds, arranged in any combination, so as to reduce, including eliminate, diffusion, including electromigration, between portions above and portions below as a result.

Depicted at 520 a PCM material may attain a temperature that results in a phase change. A device heater may comprise titanium nitride, titanium nitride doped with silicon, or may be any other conductive or partially conductive material capable of converting an electrical current into heat energy by way of ohmic, resistive, or Joule heating, for example. A voltage drop exhibited by a first conductor may be less than a voltage drop exhibited by an intervening separation material. Further, a voltage drop exhibited by a device heater may represent a voltage drop larger than a voltage drop exhibited by an intervening separation material.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and storage of charge or a release of stored charge. Likewise, in other memory devices, a change of state may comprise a physical change or transformation in magnetic orientation or a physical change or transformation in molecular structure, such as from crystalline to amorphous or vice-versa. In still other memory devices, a change in physical state may involve quantum mechanical phenomena, such as, superposition, entanglement, or the like, which may involve quantum bits (qubits), for example. The foregoing is not intended to be an exhaustive list of all examples in which a change in state for a binary one to a binary zero or vice-versa in a memory device may comprise a transformation, such as a physical transformation. Rather, the foregoing are intended as illustrative examples.

A computer-readable (storage) medium typically may be non-transitory or comprise a non-transitory device. In this context, a non-transitory storage medium may include a device that is tangible, meaning that the device has a concrete physical form, although the device may change its physical state. Thus, for example, non-transitory refers to a device remaining tangible despite this change in state.

The terms, "and", "or", and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe a plurality or some other combination of features, structures or characteristics. However, it should be noted that this is merely an illustrative example and claimed subject matter is not limited to this example.

Methodologies described herein may be implemented by various approaches depending, at least in part, on applications according to particular features or examples. For example, such methodologies may be implemented in hardware, firmware, or combinations thereof, along with software. In a hardware implementation, for example, a processing unit may be implemented within one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, electronic devices, other devices units designed to perform the functions described herein, or combinations thereof.

In the preceding detailed description, numerous specific details have been set forth to provide a thorough understanding of claimed subject matter. However, it will be understood by those skilled in the art that claimed subject matter may be practiced without these specific details. In other instances, methods or devices that would be known by one of ordinary skill have not been described in detail so as not to obscure claimed subject matter.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of appended claims, and equivalents thereof.

What is claimed is:

1. A device, comprising:
an arrangement of materials stacked above a device heater, the arrangement including a separation material, wherein an edge of the separation material laterally extends farther than an edge of a conductor in a first direction, the edge of the separation material laterally extending at least to a location directly above the device heater,
wherein the conductor over the arrangement is offset from directly above the device heater; and
wherein a conductive path from the conductor to the device heater is via the separation material of the arrangement.

2. The device of claim 1, wherein the device heater is at least partially surrounded by a dielectric.

3. The device of claim 1, wherein the separation material exhibits a resistance of between about 5 and about 50 percent of the resistance of the device heater.

4. The device of claim 1, wherein the edge of the conductor is offset a lateral distance from a location directly above the device heater by an amount approximately equal to a multiple of a half-pitch of an applicable lithographic process.

5. The device of claim 1, wherein the device can change a memory material from a first phase to a second phase.

6. The device of claim 1, wherein the first phase comprises a crystalline phase, and wherein the second phase comprises an amorphous phase.

7. The device of claim 5, wherein the first phase comprises an amorphous phase, and wherein the second phase comprises a crystalline phase.

8. The device of claim 1, wherein the separation material is capable of reducing diffusion between the conductor and an active material included in the arrangement.

9. The device of claim 1, wherein the device heater is capable of changing a memory material to a rupture phase.

10. A circuit, comprising:
a separation material below a conductor and above a device heater, wherein an edge of the separation material laterally extends farther than an edge of the conductor in a first direction, the edge of the separation material laterally extending at least to a location directly above the device heater, and
a conductive path from the conductor to the device heater, wherein the conductor and a part of the conductive path are laterally offset from directly above the device heater.

11. The circuit of claim 10, wherein the device heater is configured to change a phase of a phase material of a memory device.

12. The circuit of claim 11, wherein the device heater is configured to change the phase of the phase material from a first phase having a first resistance to a second phase having a second resistance that is lower than the first resistance.

13. The circuit of claim 11, wherein the device heater is configured to change a state of the phase material, while the phase material is in a first phase, from a first state to a second state that is less amorphous than the first state.

14. The circuit of claim 13, wherein the device heater is configured to change the state of the phase material, while the phase material is in a second phase, from a first state to a second state that is more crystalline than the first state.

15. The circuit of claim 13, wherein the device heater is configured to change the state of the phase material to the second state after the phase material has been changed to a second phase.

16. The circuit of claim 11, further comprising:
a conductive plug beneath the device heater, wherein the conductive path comprises a path to the conductive plug.

17. A device, comprising:
an arrangement of materials above a device heater, the arrangement including a first material, wherein an edge of the first material laterally extends farther than an edge of a conductor in a first direction, the edge of the first material laterally extending at least to a location directly above the device heater; and
wherein the conductor is in contact with at least some of the arrangement of materials,
wherein a conductive path from the conductor to the device heater is via the arrangement of materials, and
wherein the device heater and a part of the conductive path are laterally offset from directly below the conductor.

18. The device of claim 17, wherein the device heater is at least partially disposed within a dielectric material.

19. The device of claim 17, wherein the device heater is above a switch.

20. The device of claim 17, wherein the first material comprises:
a separation material, a memory material, or a combination thereof.

* * * * *